US009557417B2

United States Patent
Elian et al.

(10) Patent No.: US 9,557,417 B2
(45) Date of Patent: Jan. 31, 2017

(54) SONIC SENSORS AND PACKAGES

(71) Applicant: Infineon Technologies AG, Neubiberg (DE)

(72) Inventors: Klaus Elian, Alteglofshein (DE); Horst Theuss, Wenzenbach (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 14/969,848

(22) Filed: Dec. 15, 2015

(65) Prior Publication Data
US 2016/0103219 A1    Apr. 14, 2016

Related U.S. Application Data

(62) Division of application No. 13/253,534, filed on Oct. 5, 2011, now Pat. No. 9,239,386.

(51) Int. Cl.
| G01S 15/10 | (2006.01) |
| G01S 15/08 | (2006.01) |
| G01S 7/521 | (2006.01) |
| B81B 7/00 | (2006.01) |
| G10K 11/00 | (2006.01) |
| H01L 41/09 | (2006.01) |

(52) U.S. Cl.
CPC ............. *G01S 15/10* (2013.01); *B81B 7/0061* (2013.01); *G01S 7/521* (2013.01); *G01S 15/08* (2013.01); *G10K 11/004* (2013.01); *B81B 2201/0257* (2013.01); *B81B 2207/012* (2013.01); *H01L 41/0973* (2013.01); *H04R 2201/003* (2013.01)

(58) Field of Classification Search
CPC ....... G01S 15/08; H01L 41/0973; H01L 29/84
See application file for complete search history.

(56) References Cited

U.S. PATENT DOCUMENTS

| 4,354,132 A | 10/1982 | Borburgh et al. |
| 4,736,748 A | 4/1988 | Nakamura et al. |
| 4,737,939 A | 4/1988 | Ricketts |
| 5,047,633 A | 9/1991 | Finlan et al. |
| 5,389,848 A | 2/1995 | Trzaskos |
| 5,631,875 A | 5/1997 | Romes et al. |

(Continued)

FOREIGN PATENT DOCUMENTS

EP    2042828 A1    4/2009

OTHER PUBLICATIONS

MaxBotix, Inc., LV-MaxSonar®—EZ1 High Performance Sonar Range Finder, LV_MaxSonar®—EZ1 Data Sheet, © 2005-2011, www.maxbotix.com, pp. 1-2.

(Continued)

*Primary Examiner* — Luke Ratcliffe
*Assistant Examiner* — Hovhannes Baghdasaryan
(74) *Attorney, Agent, or Firm* — Schiff Hardin LLP

(57) ABSTRACT

Embodiments relate to integrated sonic sensors having a transmitter, a receiver and driver electronics integrated in a single, functional package. In one embodiment, a piezoelectric signal transmitter, a silicon microphone receiver and a controller/amplifier chip are concomitantly integrated in a semiconductor housing. The semiconductor housing, in embodiments, is functional in that at least a portion of the housing can comprise the piezoelectric element of the transmitter, with an inlet aperture opposite the silicon microphone receiver.

13 Claims, 2 Drawing Sheets

(56) References Cited

U.S. PATENT DOCUMENTS

| | | |
|---|---|---|
| 6,508,133 B1 | 1/2003 | Adachi et al. |
| 6,691,578 B1 | 2/2004 | Puskas |
| 6,709,393 B2 | 3/2004 | Ogawa |
| 6,776,401 B2 | 8/2004 | Krickau et al. |
| 7,172,195 B2 | 2/2007 | Sano et al. |
| 7,421,900 B2 | 9/2008 | Karasawa et al. |
| 7,437,960 B2 | 10/2008 | Priebsch |
| 7,779,531 B2 | 8/2010 | Ladabaum et al. |
| 7,880,721 B2 | 2/2011 | Suzuki et al. |
| 7,942,059 B2 | 5/2011 | Patz et al. |
| 2004/0113521 A1 | 6/2004 | Buhler et al. |
| 2004/0236223 A1 | 11/2004 | Barnes et al. |
| 2007/0278601 A1 | 12/2007 | Goodelle et al. |
| 2008/0165982 A1 | 7/2008 | Hankey et al. |
| 2008/0166004 A1 | 7/2008 | Sanford et al. |
| 2008/0217709 A1 | 9/2008 | Minervini et al. |
| 2008/0290756 A1 | 11/2008 | Huang |
| 2009/0084186 A1 | 4/2009 | Patz et al. |
| 2009/0168088 A1 | 7/2009 | Rosenblatt |
| 2010/0207257 A1 | 8/2010 | Lee |
| 2010/0280307 A1 | 11/2010 | Lineaweaver et al. |
| 2010/0322443 A1 | 12/2010 | Wu et al. |
| 2011/0003614 A1* | 1/2011 | Langereis ............... G01S 15/06 455/550.1 |
| 2011/0038492 A1 | 2/2011 | Ronald et al. |
| 2011/0062535 A1 | 3/2011 | McMullen et al. |
| 2011/0063951 A1 | 3/2011 | Jiang et al. |
| 2011/0198714 A1 | 8/2011 | Yang |
| 2011/0204456 A1* | 8/2011 | Leclair ............... B81C 1/00238 257/416 |
| 2012/0007743 A1 | 1/2012 | Solomon |
| 2012/0218867 A1 | 8/2012 | Kandori et al. |

OTHER PUBLICATIONS

Piezolectricity—Wikipedia, the free encyclopedia, as available on Oct. 5, 2011, at http://en.wikipedia.org/wiki/Piezoelectric-Crystal, pp. 1-14.

Ultrasonic Sensors: Knowles, as available on Oct. 5, 2011, at www.knowles.com/search/products/s_ultrasonic.jsp, 1 page.

Ultrasonic sensor K-14WP10 40kHz Waterproof IP64 (OxH) 25.6×22.55mm, No. 182271-62 (Part No. K-14WP10) as available on Oct. 5, 2011, at shop.conrad-uk.com, 2 pages.

Asuro Wiki-Ultrasonic sensors on Eval Board, as available on Oct. 5, 2011, at www.asurowiki.de/pmwiki/pmwiki.php/Main/UltraschallsensorenAmEvalBoard (in Germany, with English machine translation obtained from www.google.com on Oct. 5, 2011).

Kemo Electronic B214 Ultrasonic Proximity Alarm [B214] Kemo Electronic, B214 Ultrasonic Proximity Alarm, MCM Part #28-6350, as available on Oct. 5, 2011, at www.mcmelectronics.com/product/KEMO-ELECTRONI-B214-/28-6350, 1 page.

182244 Ultrasonic Sensor A-14P20 (Ultraschall Sensor A-14P20), as available on Oct. 5, 2011, at shop.conrad-uk.com, 3 pages.

182258 Ultrasonic Sensor A-18P20 (Ultraschall Sensor A-18P20), as available on Oct. 5, 2011, at shop.conrad-uk.com, 3 pages.

\* cited by examiner

SONIC SENSORS AND PACKAGES

RELATED APPLICATION

This application is a division of application Ser. No. 13/253,534 filed Oct. 5, 2011, which is hereby fully incorporated herein by reference.

TECHNICAL FIELD

The invention relates generally to sonic sensors and more particularly to packages for sonic, such as ultrasonic, sensors that integrate a transmitter, receiver and driver.

BACKGROUND

Ultrasonic sensors can be used for distance measurement and object detection. One such application is the incorporation of ultrasonic sensors in the bumpers and fenders of cars for parking assistance, obstruction detection and adaptive cruise control.

Conventional ultrasonic sensors comprise an ultrasonic transmitter, an ultrasonic receiver and driver electronics soldered onto printed circuit boards (PCBs) and combined in modules. Other conventional sensors have a single transceiver unit that toggles between transmitting and receiving. These solutions suffer from several drawbacks, including the need to solder the components onto PCBs and increased space requirements for the combined module, among others.

Therefore, there is a need for improved ultrasonic sensors.

SUMMARY

Embodiments relate to integrated sonic sensors having a transmitter, a receiver and driver electronics integrated in a single, functional package.

In an embodiment, a sensor system comprises a silicon microphone; a controller integrated circuit coupled to the microphone; a transmitter coupled to the controller integrated circuit and comprising a piezoelectric element; and a housing comprising a cover portion having an aperture, wherein the microphone, the controller integrated circuit and the transmitter are provided within the housing.

In an embodiment, a method comprises providing an integrated sensor including a transmitter, a microelectromechanical (MEMS) microphone and driver electronics integrated in a housing having a cover comprising a piezoelectric element; transmitting a signal by the transmitter and the piezoelectric element; receiving a reflected signal by the receiver through an aperture in the cover; and determining a time of flight of the signal.

In an embodiment, a semiconductor chip package comprises a housing for at least one semiconductor chip, wherein at least a portion of the housing is configured as a sound generating element to generate sound waves based on electrical signals provided by an integrated circuit of the at least one semiconductor chip.

BRIEF DESCRIPTION OF THE DRAWINGS

The invention may be more completely understood in consideration of the following detailed description of various embodiments of the invention in connection with the accompanying drawings, in which.

Figure 1:
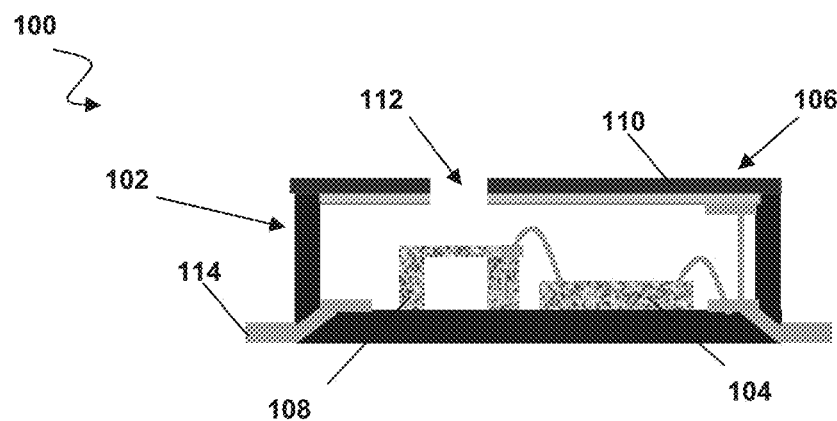
FIG. 1 is a diagram of a sensor system according to an embodiment.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention as defined by the appended claims.

DETAILED DESCRIPTION

Embodiments relate to integrated ultrasonic sensors having a transmitter, a receiver and driver electronics integrated in a single, functional package. In one embodiment, a piezoelectric signal transmitter, a silicon microphone receiver and a controller/amplifier chip are concomitantly integrated in a semiconductor housing. In embodiments, the transmitter, receiver and controller can be integrated as three separate devices, or one or more of the devices can be integrated in a single chip. The semiconductor housing, in embodiments, is functional in that at least a portion of the housing can comprise the piezoelectric element of the transmitter, with an inlet aperture opposite the silicon microphone receiver.

Figure 2:
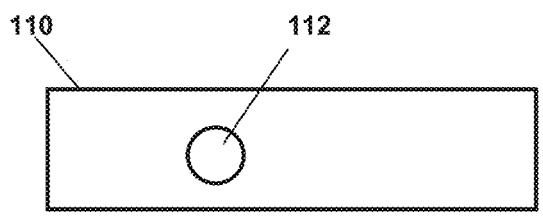
FIG. 2 is a diagram of a cover of a package of a sensor system according to an embodiment.

Referring to FIGS. 1 and 2, an integrated ultrasonic sensor system 100 is depicted. Sensor system 100 comprises a housing 102, a controller/amplifier chip 104, a piezoelectric signal transmitter 106 and a silicon microphone receiver 108 such as a microelectromechanical system (MEMS) microphone. In other embodiments, sensor system 100 can comprise a supersonic sensor system, a sonar sensor system, a radar sensor system or some other suitable sensor system. In embodiments, transmitter 106, receiver 108 and controller 104 can be integrated as separate devices, or in other embodiments one or more of the devices can be integrated in a single chip. For example, in one embodiment, transmitter 106 and controller 104 can be integrated in a single chip, and then integrated in housing 102 with receiver 108.

In an embodiment, piezoelectric signal transmitter 106 comprises a cover portion 110 of housing 102. Cover portion 110 comprises an inlet aperture 112 arranged relative to silicon microphone receiver 108 and contacts 114, such as pins, pads or wires. The size, shape, configuration and/or placement of aperture 112 can vary in embodiments. For example, aperture 112 can be oblong or located in another position on cover portion 110, though in general aperture 112 is arranged relative to receiver 108 such that reflected signals can pass through aperture 112 to receiver 108. In embodiments, cover portion 110 can comprise a piezoelectric plastic foil, such as polyvinylidenfluorid (PVDF); ceramic, such as lead zirconate titanate (PZT); crystal; thin film; silicon; metal or some other suitable membrane material. To transfer the electric signal from chip 104 to cover portion 110, a contact can be provided between cover portion 110 and chip 104. The contact can be flexible, for example to address changes in the vertical distance between cover portion 110 and chip 104. The contact can comprise a zebra-flex, needle, spring, solder, wire or other suitable contact. In one embodiment, cover portion 110 comprises a metal and ceramic piezoelectric loudspeaker coupled to the remainder of housing 102, wherein a remainder of housing can comprise, for example, a dual small outline flat (DSOF) package.

Cover portion 110, in cooperation with the other components of transmitter 108, emits ultrasonic or other sound signals. The emitted signals, such as signal pulses, can be reflected to system 100 by objects, passing through aperture 112 to be received by receiver 108. Receiver 108 and/or controller/amplifier chip 104, which can comprise an application-specific integrated circuit (ASIC) in an embodiment, can calculate a time of flight of the signal for distance determination relative to sensor system 100.

The integration of transmitter 106 as the sonic generation element directly into cover portion 110 of a semiconductor chip package allows synergetic combination of the covering or protection function provided by cover portion 110 for the one or more semiconductor chips with the functionality of generating the sonic sound for operation of sensor system 100. In other words, the package not only provides the conventional coverage or protection but is further functionalized to provide additional functionality by being capable of producing sonic waves. This provides a miniaturized system by providing an integrated solution in which the package has the additional sonic generation function while also reducing manufacturing costs because no separate manufacturing steps are necessary and the housing together with the sonic generating element can be manufactured integrally. Cover portion 100 can for example include a multi-layer structure where one or more of the layers are sonic generating layers, for example piezoelectric layers, in embodiments.

Figure 3:
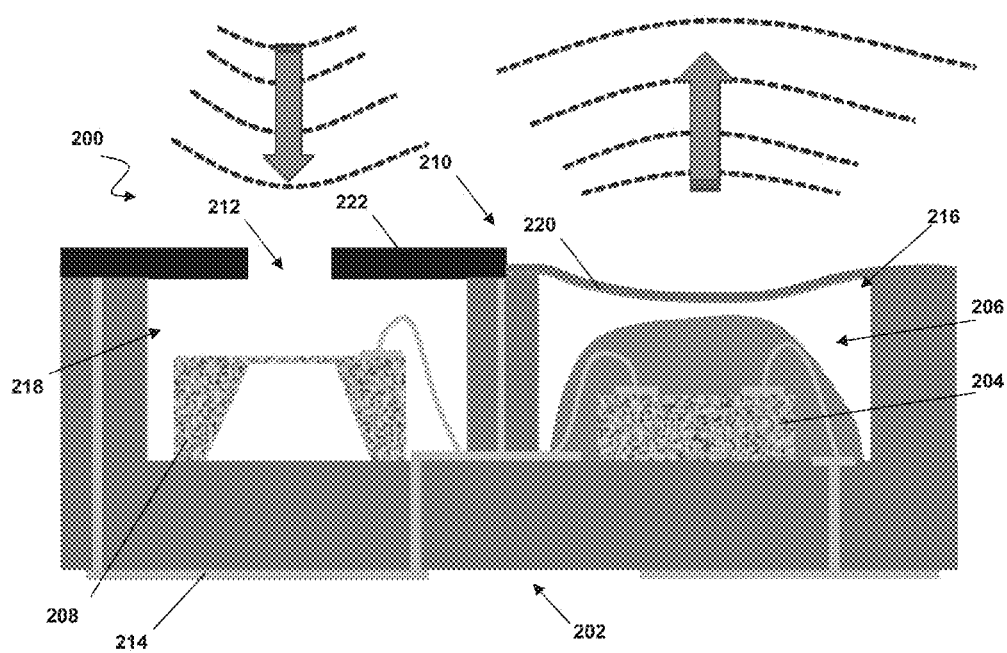
FIG. 3 is a diagram of a sensor system according to an embodiment.

Another embodiment of a sensor system 200 is depicted in FIG. 3. Sensor system 200 comprises a housing 202, a controller/amplifier 204 such as an ASIC, a transmitter 206, a receiver 208, a cover portion 210 having an aperture 212, and contacts 214. In sensor system 200, housing 202 comprises two portions: a transmitter portion 216 and a receiver portion 218. Cover portion 210 also comprises two portions: a transmitter membrane portion 220 and a receiver portion 222. Transmitter membrane portion 220 and receiver portion 222 can comprise any of the materials and/or configurations discussed with respect to FIGS. 1 and 2. In one embodiment as depicted in FIG. 3, receiver portion 222 can comprise a metal lid that provides electrical shielding.

Embodiments thus are related to miniaturized integrated sensor systems comprising microphones, ASICs and transmitters in a package, with a portion of the package being functional as part of the transmitter. Embodiments have applicability to vehicular and consumer applications, such as gaming, smart phone, tablet computer and other applications of distance/object detection. For example, the system can be implemented in a vehicle such as an automobile, a bicycle, an electric bicycle, a scooter, a SEGWAY, construction equipment and a boat, among others. The system can also be implemented in mobile/smart phone and handheld or console gaming systems, for example.

Various embodiments of systems, devices and methods have been described herein. These embodiments are given only by way of example and are not intended to limit the scope of the invention. It should be appreciated, moreover, that the various features of the embodiments that have been described may be combined in various ways to produce numerous additional embodiments. Moreover, while various materials, dimensions, shapes, configurations and locations, etc. have been described for use with disclosed embodiments, others besides those disclosed may be utilized without exceeding the scope of the invention.

Persons of ordinary skill in the relevant arts will recognize that the invention may comprise fewer features than illustrated in any individual embodiment described above. The embodiments described herein are not meant to be an exhaustive presentation of the ways in which the various features of the invention may be combined. Accordingly, the embodiments are not mutually exclusive combinations of features; rather, the invention may comprise a combination of different individual features selected from different individual embodiments, as understood by persons of ordinary skill in the art.

Any incorporation by reference of documents above is limited such that no subject matter is incorporated that is contrary to the explicit disclosure herein. Any incorporation by reference of documents above is further limited such that no claims included in the documents are incorporated by reference herein. Any incorporation by reference of documents above is yet further limited such that any definitions provided in the documents are not incorporated by reference herein unless expressly included herein.

For purposes of interpreting the claims for the present invention, it is expressly intended that the provisions of Section 112, sixth paragraph of 35 U.S.C. are not to be invoked unless the specific terms "means for" or "step for" are recited in a claim.

What is claimed is:

1. A method comprising:
providing an integrated sensor including a transmitter, a microelectromechanical (MEMS) microphone and driver electronics, the MEMS microphone and the driver electronics being integrated in a housing and disposed on a surface of the housing, wherein the integrated sensor further includes a cover disposed on the housing opposite the surface of the housing, the cover comprising a piezoelectric element of the transmitter;
transmitting a signal using the piezoelectric element of the transmitter;
receiving a reflected signal by the MEMS microphone through an aperture in the cover; and
determining a time of flight of the signal.

2. The method of claim 1, further comprising determining a distance, from the integrated sensor, of an object reflecting the signal from the time of flight of the signal.

3. The method of claim 1, wherein transmitting a signal comprises transmitting one of an ultrasonic signal, a supersonic signal, a sonar signal or a radar signal.

4. The method of claim 1, further comprising forming the housing with a transmitter portion having a transmitter portion cover comprising the piezoelectric element and a receiver portion having a receiver portion cover.

5. The method of claim 4, wherein forming the housing further comprises forming the piezoelectric element from at least one of metal, ceramic, plastic or foil.

6. The method of claim 4, wherein forming the housing further comprises forming the receiver portion cover from metal.

7. The method of claim 1, further comprising mounting the integrated sensor in a vehicle.

8. The method of claim 7, wherein the vehicle is selected from the group consisting of an automobile, a bicycle, an electric bicycle, a scooter, a SEGWAY, construction equipment and a boat.

9. The method of claim 1, further comprising mounting the integrated sensor in one of a mobile phone or a gaming system.

10. The method of claim 1, further comprising mounting the sensor in a gaming system, wherein the gaming system is one of a handheld gaming system or a console gaming system.

11. The method of claim 1, further comprising:
   forming the aperture in the cover such that the aperture is formed opposite the surface of the housing and opposite the MEMS microphone disposed on the surface of the housing.

12. The method of claim 1, wherein the cover comprises a multilayered structure, the piezoelectric element being a piezoelectric layer formed as a layer of the multilayered structure of the cover.

13. The method of claim 4, wherein the transmitter portion is a different portion of the housing from the receiver portion of the housing.

* * * * *